US009257321B2

(12) United States Patent
Lin et al.

(10) Patent No.: US 9,257,321 B2
(45) Date of Patent: Feb. 9, 2016

(54) SINGULATION APPARATUS AND METHOD

(71) Applicant: TAIWAN SEMICONDUCTOR MANUFACTURING COMPANY LTD., Hsinchu (TW)

(72) Inventors: Chun-Cheng Lin, New Taipei (TW); Yu-Peng Tsai, Taipei (TW); Meng-Tse Chen, Pingtung County (TW); Ming-Da Cheng, Hsinchu (TW); Chung-Shi Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 74 days.

(21) Appl. No.: 13/917,318

(22) Filed: Jun. 13, 2013

(65) Prior Publication Data
US 2014/0370659 A1    Dec. 18, 2014

(51) Int. Cl.
*H01L 21/683*    (2006.01)
*H01L 21/78*    (2006.01)
*H01L 21/67*    (2006.01)

(52) U.S. Cl.
CPC ...... *H01L 21/6838* (2013.01); *H01L 21/67092* (2013.01); *H01L 21/78* (2013.01)

(58) Field of Classification Search
None
See application file for complete search history.

(56) References Cited

U.S. PATENT DOCUMENTS

| 4,795,518 | A | * | 1/1989 | Meinel et al. | 156/285 |
| 5,618,759 | A | * | 4/1997 | Boysel | 438/464 |
| 6,250,990 | B1 | * | 6/2001 | Yoshii et al. | 451/5 |
| 2008/0233680 | A1 | * | 9/2008 | Okamoto et al. | 438/118 |

* cited by examiner

*Primary Examiner* — Scott B Geyer
*Assistant Examiner* — Alia Sabur
(74) *Attorney, Agent, or Firm* — WPAT, P.C.; Anthony King

(57) ABSTRACT

A singulation apparatus includes a carrier having a plurality of singulation sites and a scribe line between each of the plurality of singulation sites and an adjacent singulation site. The carrier has a top surface configured to receive a semiconductor substrate thereon. Each of the plurality of singulation sites includes a deformable portion and at least one vacuum hole. The at least one vacuum hole and the deformable portion is configured to form a seal around the at least one vacuum holes when a force is applied. The present disclosure further includes a method of manufacturing semiconductor devices, especially for a singulation process.

27 Claims, 22 Drawing Sheets

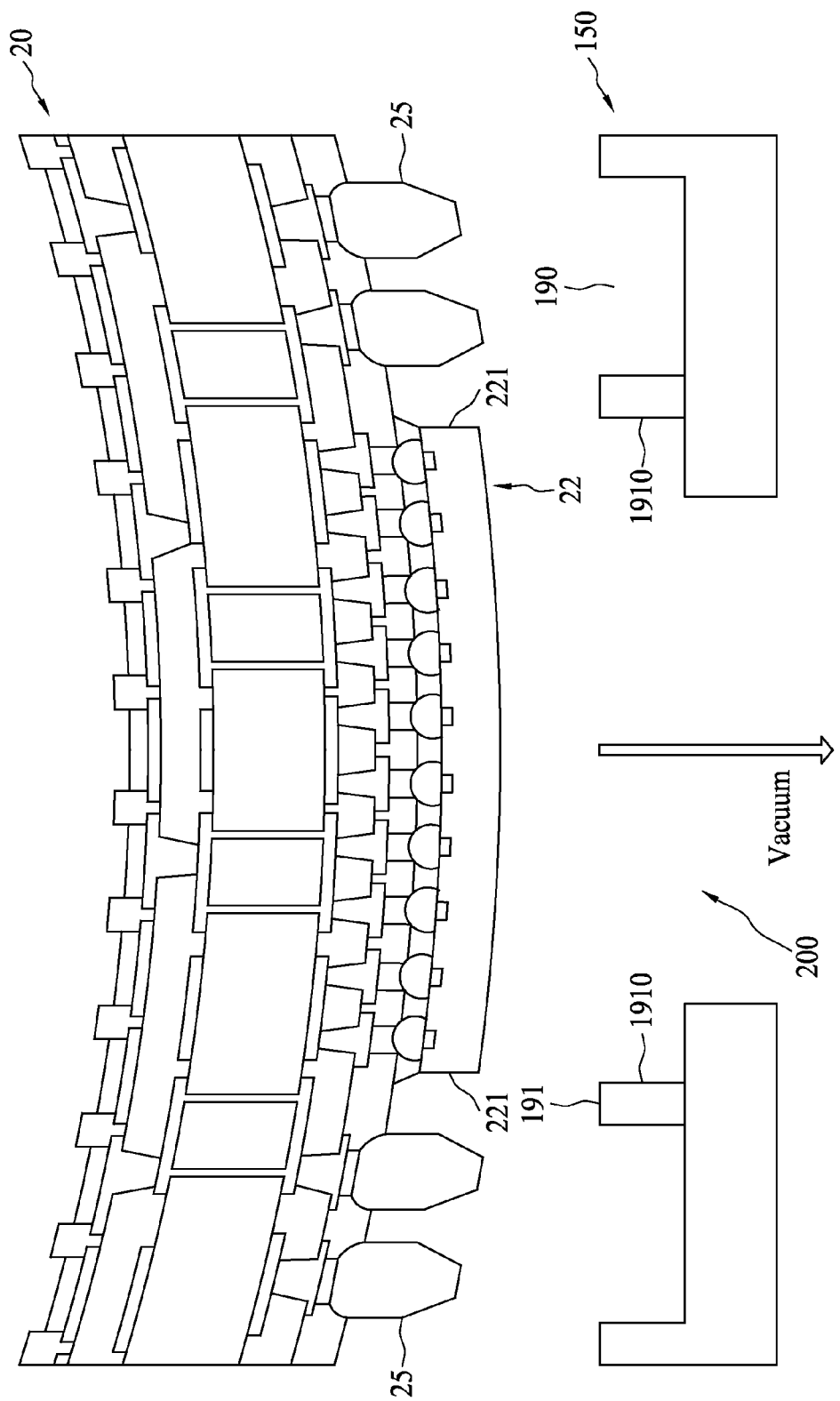

SINGULATION APPARATUS AND METHOD

FIELD

The disclosure relates to a manufacturing apparatus, and more particularly to a singulation apparatus and methods of singulation.

BACKGROUND

Semiconductor devices are usually formed or arranged on a same substrate before they enter the packaging stage. The packaging stage includes several steps that are mainly designed to form several individual semiconductor assemblies. Singulation is one of the steps adopted to separate the semiconductor devices on the same substrate into several independent units.

Singulation may occur at different stages in semiconductor manufacturing. A semiconductor substrate may be singulated into individual dies after all of the semiconductor devices and interconnects are formed. The individual dies may be packaged separately to another semiconductor substrate that is then singulated again into a packaged chip. In some semiconductor manufacturing processes commonly referred to as the wafer-level packaging, a semiconductor substrate having all of the semiconductor devices and interconnects is packaged first to another substrate before singulation. Thus singulation may occur once or more times during semiconductor manufacturing.

In some approaches, the semiconductor substrate is placed on a tooling and fixed to the top surface of the tooling during the singulation process. A saw or other cutting device then separates the individual units along scribe lines. Because a small deviation from the scribe lines may remove device portions of the individual units and render the product defective, the singulation tooling would stop or not start if the semiconductor substrate is not firmly fixed to the top surface. Improved apparatus and method for a singulation process continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2A to FIG. 5A are perspective views of various designs of a singulation site in accordance with various embodiments of the present disclosure.

FIG. 2B to FIG. 5B are perspective views of a section of various designs of a singulation site in accordance with various embodiments of the present disclosure.

FIG. 9A to FIG. 13A are perspective views of various designs of a singulation site in accordance with various embodiments of the present disclosure.

FIG. 9B to FIG. 13B are perspective views of a section of various designs of a singulation site in accordance with various embodiments of the present disclosure.

FIG. 15 is a process of disposing a semiconductor substrate on a singulation site including a groove in accordance with various embodiments of the present disclosure.

DETAILED DESCRIPTION OF THE INVENTION

One method of fixing a semiconductor substrate to be singulated on a top surface of the singulation tool includes using a vacuum to hold the semiconductor substrate in place. Each of the individual units to be separated is held by the vacuum with a separate vacuum seal. This method is very sensitive to a warpage of the semiconductor substrate or a flex of the semiconductor substrate during the cutting action or other operations after the cutting action. A small contact offset can cause a vacuum seal to not form or to break the vacuum seal.

A singulation apparatus according to the present disclosure prevents vacuum leaking during singulation process. A vacuum seal is formed when a semiconductor substrate is placed against a top surface of a carrier in the singulation tool and a vacuum is introduced. The top surface of the carrier is configured to receive a semiconductor substrate for the singulation process. Openings in the carrier allow vacuum in a vacuum hole to affix the semiconductor substrate to the carrier. According to various embodiments of the present disclosure, a deformable portion on a carrier is provided to improve the vacuum seal. The deformable portion forms a seal around the carrier's vacuum holes when a vacuum force is introduced in the vacuum hole. The singulation apparatus is also suitable for a warped semiconductor substrate since its deformable portion is deformed in conformance with the warped semiconductor substrate surface when the semiconductor substrate is under a force or against the carrier. In some embodiments, a chuck in each of the vacuum holes supports the semiconductor substrate when the deformable portion is deformed. The present disclosure also pertains to a method that includes introducing vacuum to form a seal between the semiconductor substrate and the deformable portion of the carrier. The method further includes singulating the semiconductor substrate into a plurality of semiconductor devices.

Figure 1:
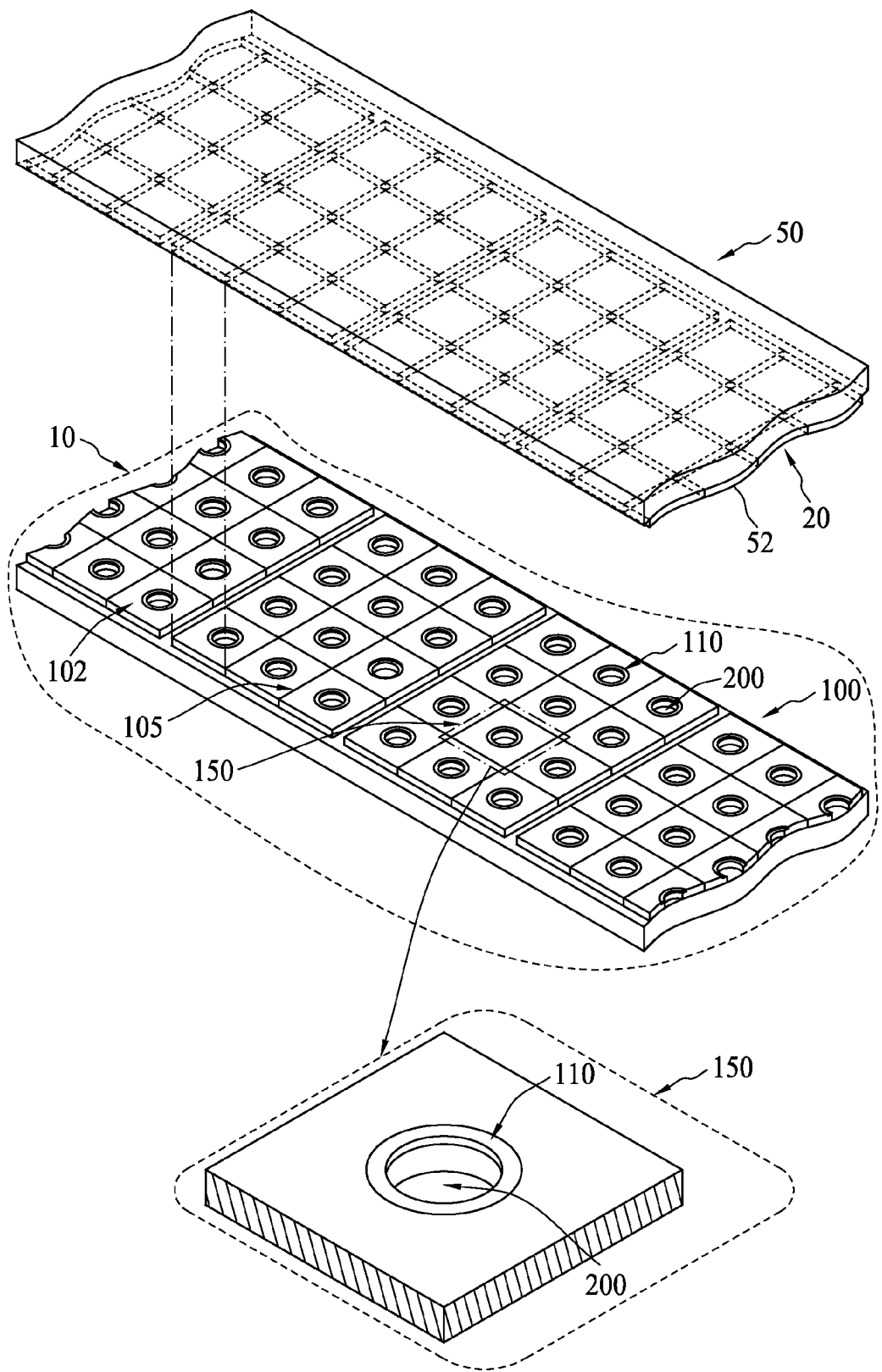
FIG. 1 is an exploded schematic a singulation apparatus having a plurality of singulation sites on a carrier in accordance with various embodiments of the present disclosure.

Referring to FIG. 1, a semiconductor substrate 50 has a plurality of semiconductor devices 20 disposed on a surface 52 of the semiconductor substrate 50. A singulation apparatus 10 is configured as a tooling to singulate the semiconductor substrate 50 into a plurality of independent semiconductor devices 20 and/or to perform other manufacturing processes on the semiconductor substrate 50. The singulation apparatus 10 is not limited for a singulation process, it is also adapted as a tooling to perform a plurality of post-singulation semiconductor operations on the singulated semiconductor devices 20.

The semiconductor substrate 50 is a package such as a molded device package with semiconductor chips encapsulated by the packaging material, a package substrate having through substrate vias and semiconductor chip, or a wafer-level package having a carrier wafer with all of the semiconductor devices and interconnects packaged first to another substrate. The semiconductor substrate 50 may also be an unpackaged semiconductor wafer having fabricated devices thereon.

The singulation apparatus 10 includes a carrier 100 and a plurality of vacuum holes 200 in the carrier 100. The carrier 100 has a top surface 102 configured to receive the semiconductor substrate 50. The carrier 100 also has a plurality of singulation sites 150 and a scribe line 105 between each singulation site and its adjacent site. Moreover, each singulation site has at least one vacuum hole 200. The carrier 100 further has a deformable portion 110, which is a fused part fixed in the carrier 100 or is a detachable part. In some embodiments, the deformable portion 110 can be removed and replaced with a deformable portion with different design in order to meet the requirement of various semiconductor substrate device arrangements or with a new deformable portion as it becomes worn or damaged during operation.

While the semiconductor substrate 50 and the carrier 100 of FIG. 1 are rectangular, other arrangements and shapes may be used so long as the semiconductor substrate 50 fit on the carrier 100. In the case where the semiconductor substrate 50 is a silicon wafer, the carrier 100 may be round.

During a singulation process, the semiconductor substrate 50 is placed on the top surface 102 of the carrier 100. A vacuum is applied to the vacuum holes 200 to secure the semiconductor substrate 50 to the carrier. Vacuum is introduced through the vacuum hole 200 to securely attaching the semiconductor substrate 50 on the top surface 102. The vacuum applies a force to pull the semiconductor substrate 50 against the deformable portion 110. The deformable portion 110 is deformed in conformance with the topography of the surface of the semiconductor substrate 50. Therefore, a seal is formed between the substrate 50 and the deformable portion 110 to prevent the semiconductor substrate 50 from moving during the various operations of the tooling.

The materials of the deformable portion 110 are deformable under a force. In some embodiments, the deformable portion is a rubber or a polymer which is or is a combination of fluoroelastomer, synthetic rubber, phenol formaldehyde resin, neoprene, nylon, polyvinyl chloride, polystyrene, polyethylene, polypropylene, polyacrylonitrile, PVB, silicone, etc. In some embodiments, the deformable portion is resistant to humidity. In some embodiments, the deformable portion can operate under a high temperature. In some embodiments, the hardness of the deformable portion is between about Shore A or D=10 and Shore A or D=100. In some embodiments, the hardness of the deformable portion is between about Shore Asker C=20 and Asker C=100. In a singulation operation, the substrate 50 is then cut or sawed along the scribe lines 105 to divide the semiconductor substrate 50 into a plurality of separated semiconductor devices 20. Other processes may be performed on the semiconductor substrate 50 before the singulation or on the singulated semiconductor devices 20 after the singulation operation.

Figure 2A:
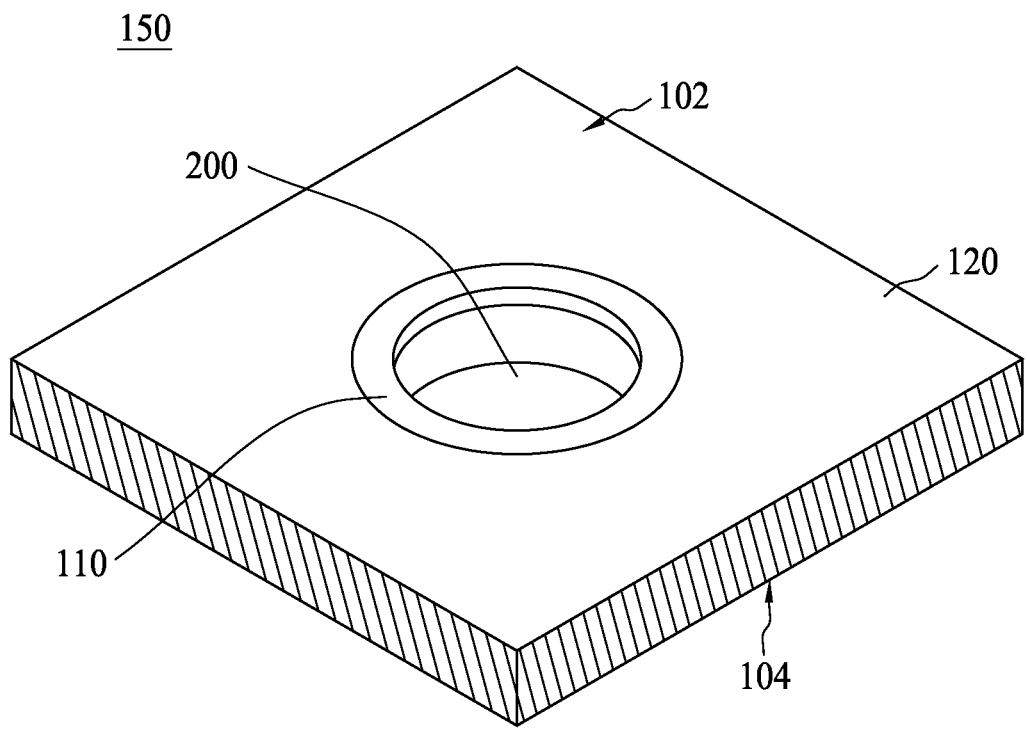
Figure 2B:
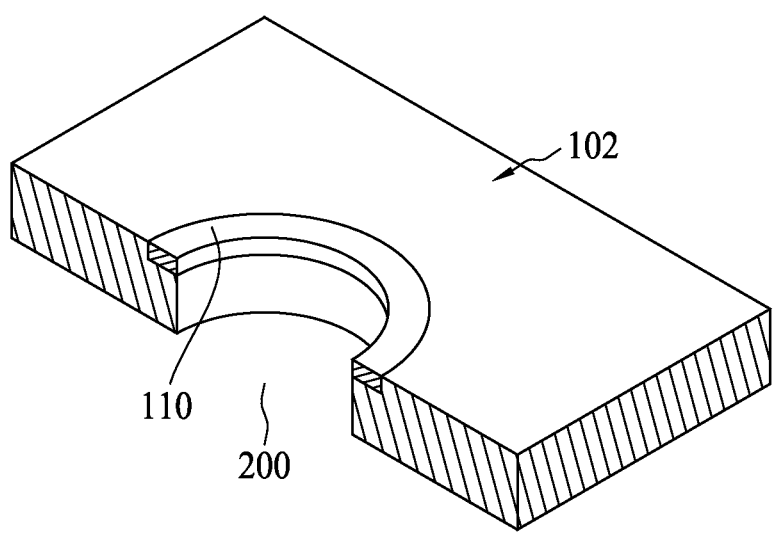

In embodiments of FIG. 2A and FIG. 2B, a singulation site 150 has at least two portions, a deformable portion 110 and a peripheral portion 120. The peripheral portion 120 is designed to be more rigid than the deformable portion 110 when a same force is applied. The deformable portion 110 is surrounded by the peripheral portion 120. In some embodiments, the deformable portion is disposed on a portion of the peripheral portion. In FIGS. 2A and 2B, the deformable portion 110 is a cylinder around the perimeter of the vacuum hole 200. The vacuum hole 200 extends from the top surface 102 to the bottom surface 104. The end at the bottom surface, is called a source end hereinafter, which means it is to be exposed to a vacuum source. According to various embodiments, the top of the deformable portion 110 is a part of the top surface 102. In some embodiments, the top of the deformable portion 110 is coplanar with a top of the peripheral portion 120. In other embodiments, the top of the deformable portion 110 extrudes above a top of the peripheral portion 120. In still other embodiments, the top of the deformable portion 110 is recessed under the peripheral portion 120.

Figure 3A:
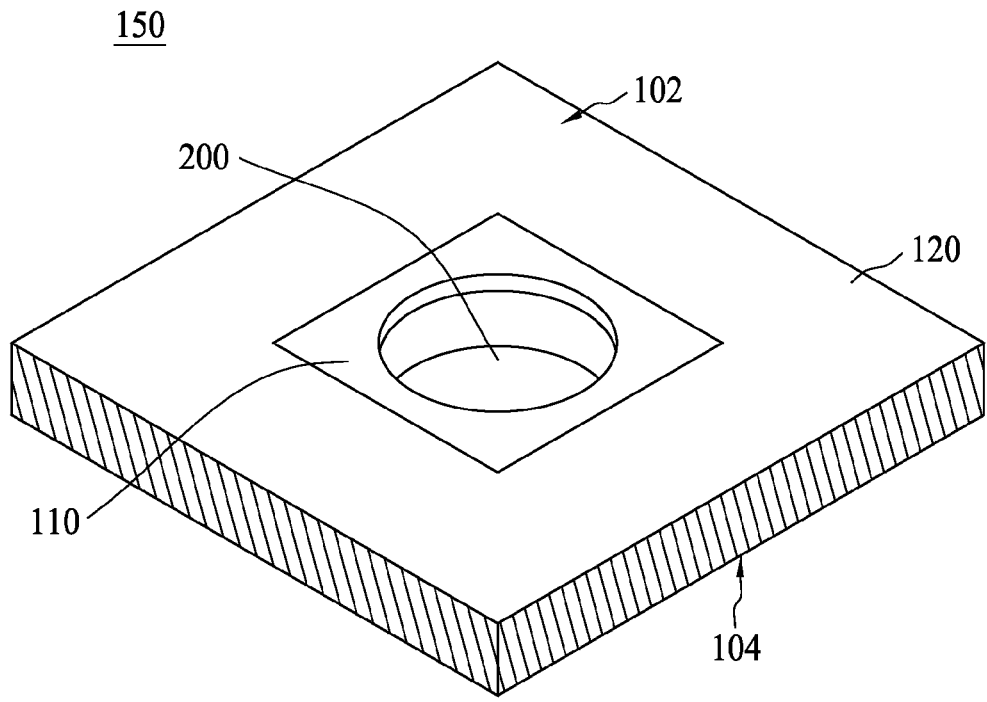
Figure 3B:
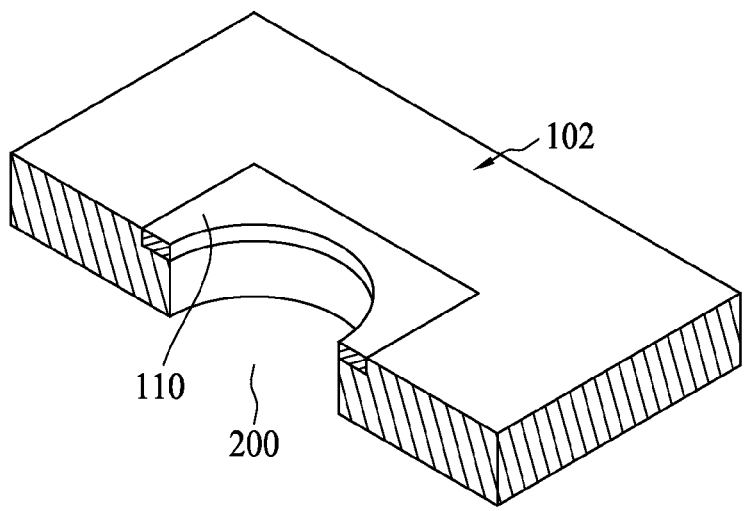

The design of the vacuum holes 200 may be in various shapes. For example, the shape of the vacuum hole is triangle, circular, quadrilateral, or irregular. The design of deformable portion 110 may also be in various shapes that correspond to the shape of the vacuum hole or not. For example, as embodiments of FIG. 3A and FIG. 3B the deformable portion 110 may be a square over a round vacuum hole.

Figure 4A:
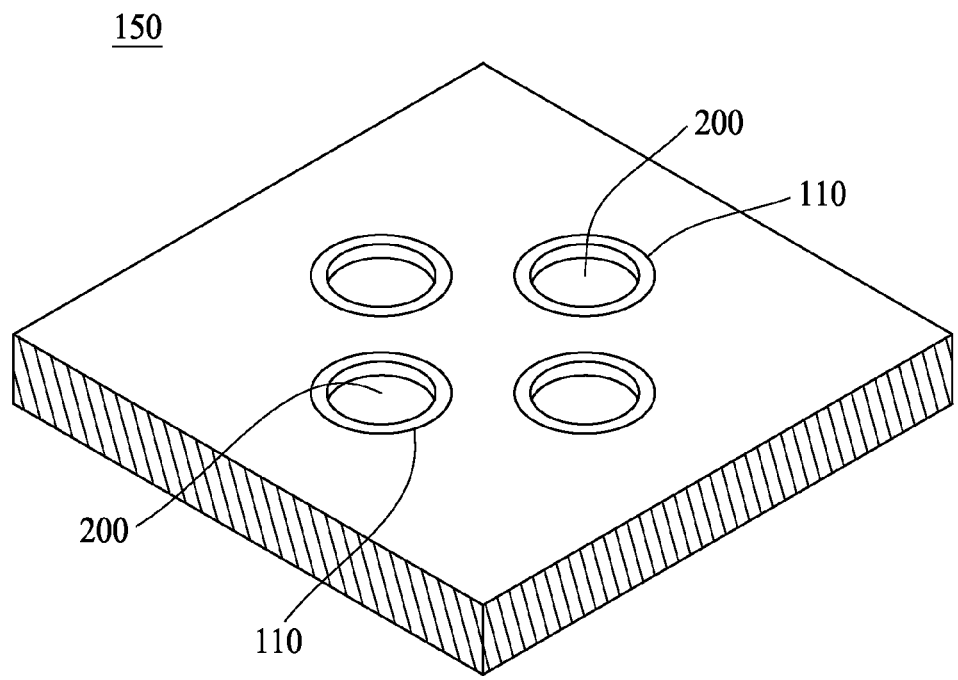
Figure 4B:
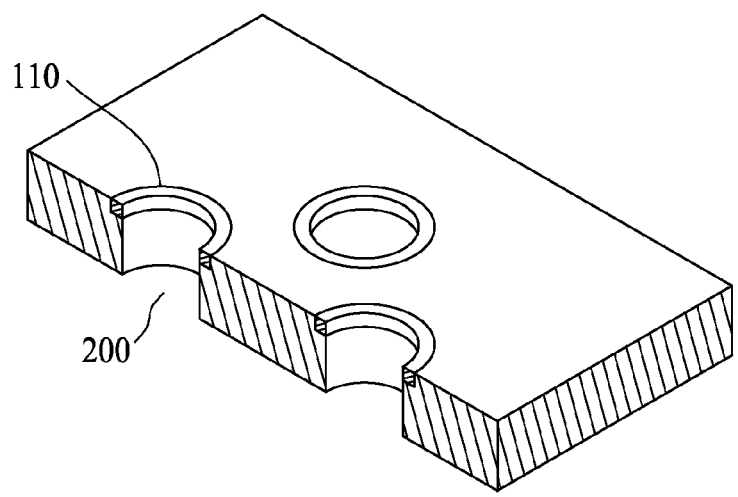

In some embodiments, a singulation site has more than one vacuum hole. Referring to FIG. 4A and FIG. 4B, a singulation site 150 has four vacuum holes 200 and each vacuum hole 200 respectively has a deformable portion 110 around its top opening. In various embodiments, fewer than four, for example two or three, or more than four, for example, six, holes may be used.

The overall size of a vacuum hole or vacuum holes is not limited. The overall size of the vacuum hole or holes in each singulation site may be designed to be between about 40% and about 90% of the semiconductor device. In some embodiments, the overall size of the vacuum hole or holes is designed to be between about 40% and 50% of the semiconductor device. In some embodiments, the overall size of the vacuum hole or holes is designed to be between about 50% and about 80% of the semiconductor device. In still other embodiments, the overall size of the vacuum hole or holes is designed to be between about 80% and 90% of the semiconductor device.

Figure 5A:
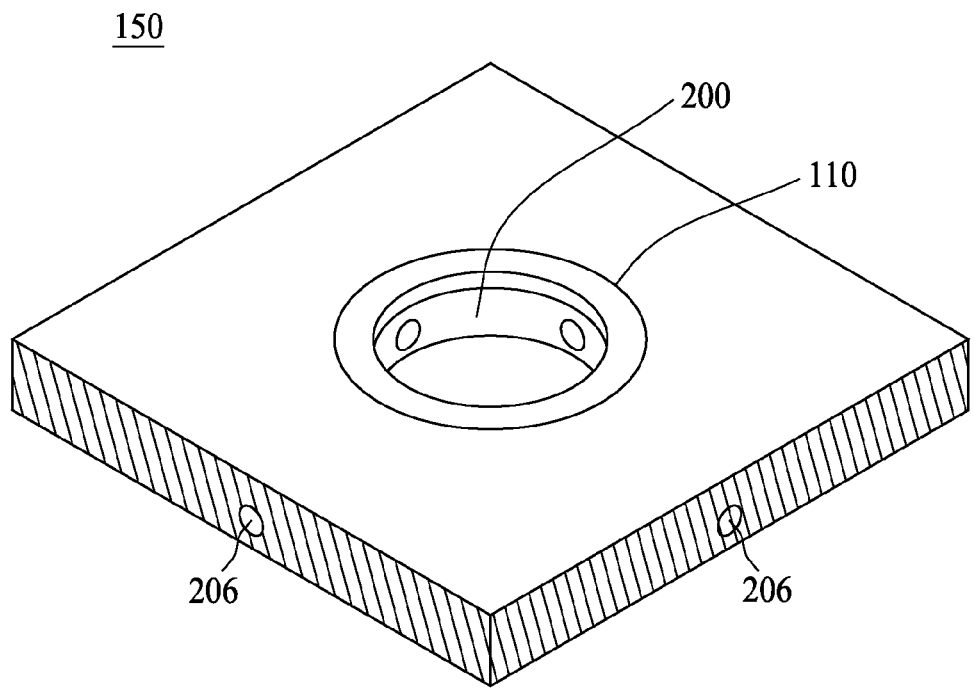
Figure 5B:
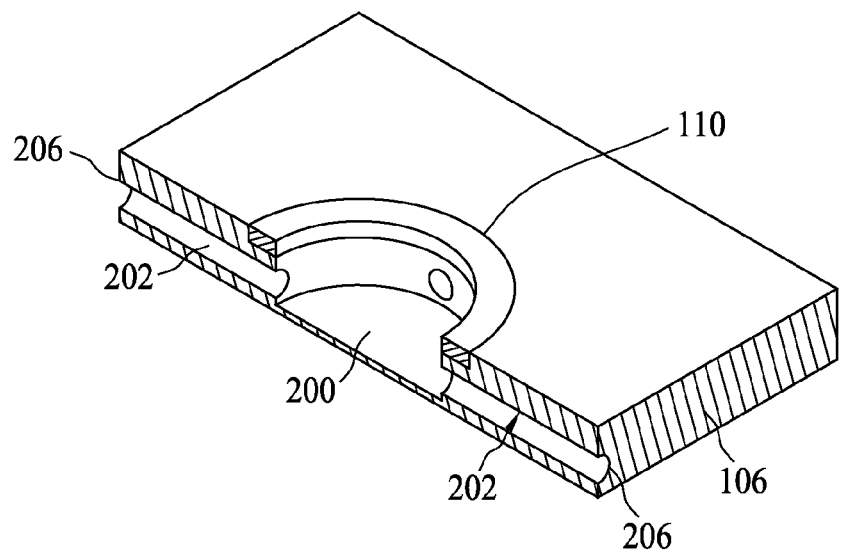

In some embodiments, a source end of a vacuum hole can be located at a sidewall. In these embodiments, a bottom surface of the carrier does not have vacuum holes. Referring to FIG. 5A and FIG. 5B, at least two channels 202 are associated with the vacuum hole 200. Each channel 202 has a source end 206 at a corresponding sidewall 106. The channels 202 of singulation sites in a row or column of the carrier are connected. The carrier may be one single piece with channels 202 connecting the vacuum holes in different singulation sites. The source ends of singulation sites located at the edge of the carrier provide the inlets for introducing vacuum. Vacuum pressure is designed to be high enough to apply enough force on each singulation site to immobilize the semiconductor substrate during operation.

Figure 6:
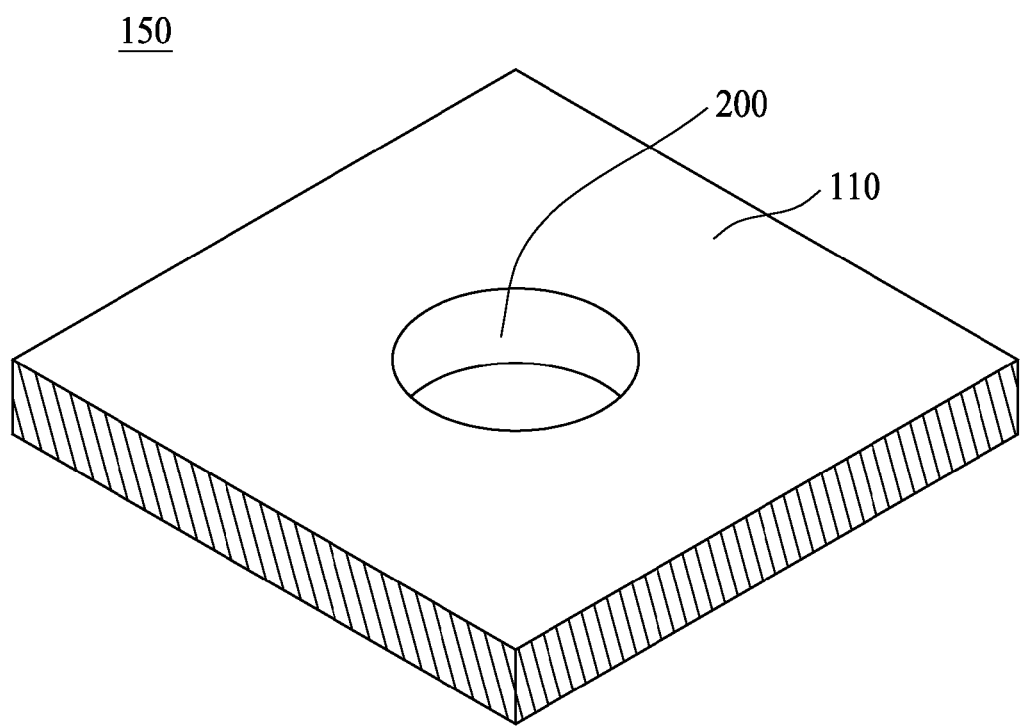
FIG. 6 is a perspective view of a design of a singulation site having a deformable portion which is a plate in accordance with various embodiments of the present disclosure.
Figure 7A:
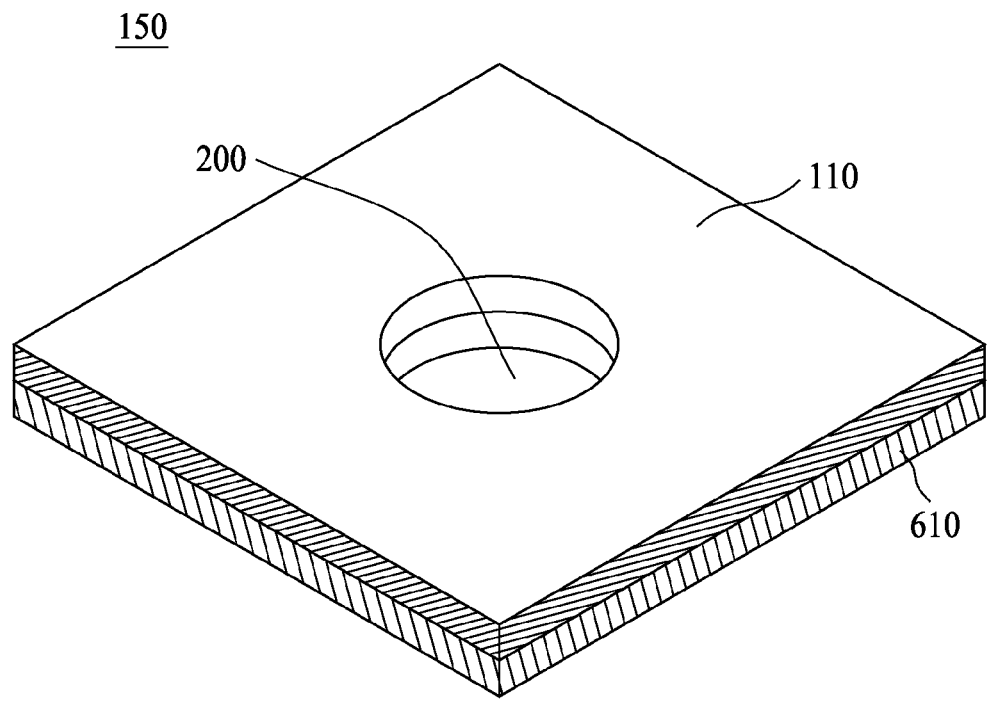
FIGS. 7A and 7B are perspective views of a singulation site having a composite plate structure in accordance with various embodiments of the present disclosure.
Figure 7B:
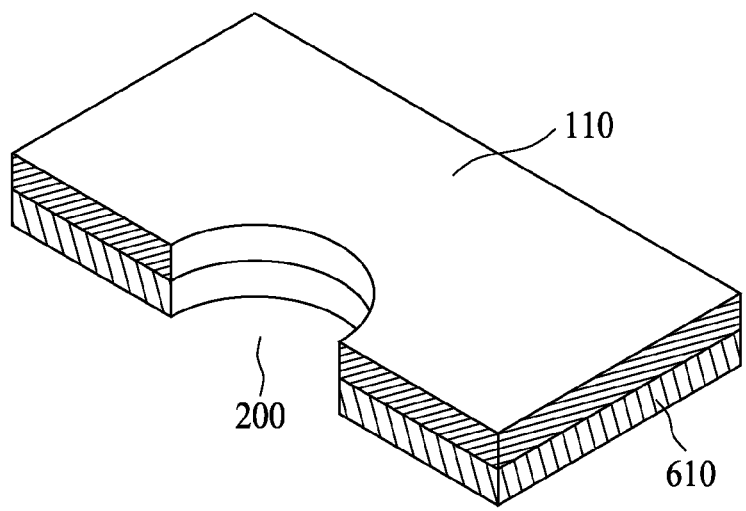

In some embodiments, the deformable portion is a plate. In FIG. 6, a singulation site 150 has a deformable portion 110 which is a deformable plate and a vacuum hole 200 extending through the plate. In FIG. 7A and FIG. 7B, the singulation site 150 is a composite plate structure. The singulation site 150 has a deformable plate 110 disposed on another plate 610. The plate 610 is more rigid than the deformable plate 110.

Figure 8:
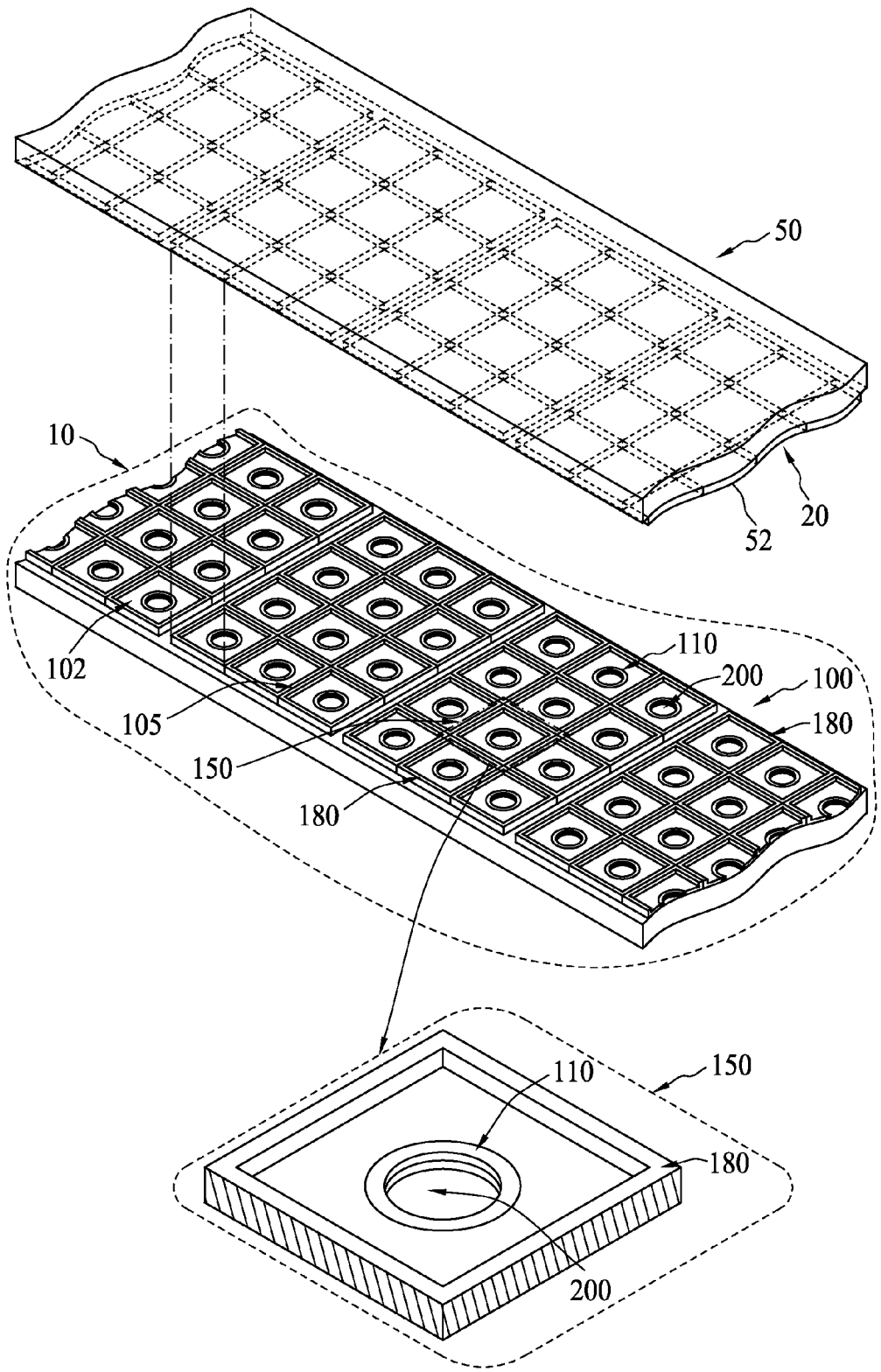
FIG. 8 is an exploded schematic a singulation apparatus having a plurality of singulation sites on a carrier in accordance with various embodiments of the present disclosure.

Referring to FIG. 8, a singulation apparatus 10 in accordance with various embodiments of the present disclosure has a plurality of singulation sites 150 and a plurality of vacuum holes 200. Each singulation site 150 has least one vacuum hole 200 and a rim 180 which forms the boundary of each singulation site 150. A scribe line 105 is located between each singulation site and its adjacent site. The rim 180 is between the vacuum hole 200 and the scribe line 105. The rim 180 extrudes above the plane of the deformable portion 110 and is configured as a partition wall. Each to-be singulated semiconductor device 20 is mounted on the semiconductor substrate 50. When placed on the carrier 100, each to-be singulated semiconductor device 20 is disposed inside the rim. Each singulation site 150 further has a deformable portion 110 proximate to the vacuum hole 200.

Figure 9A:
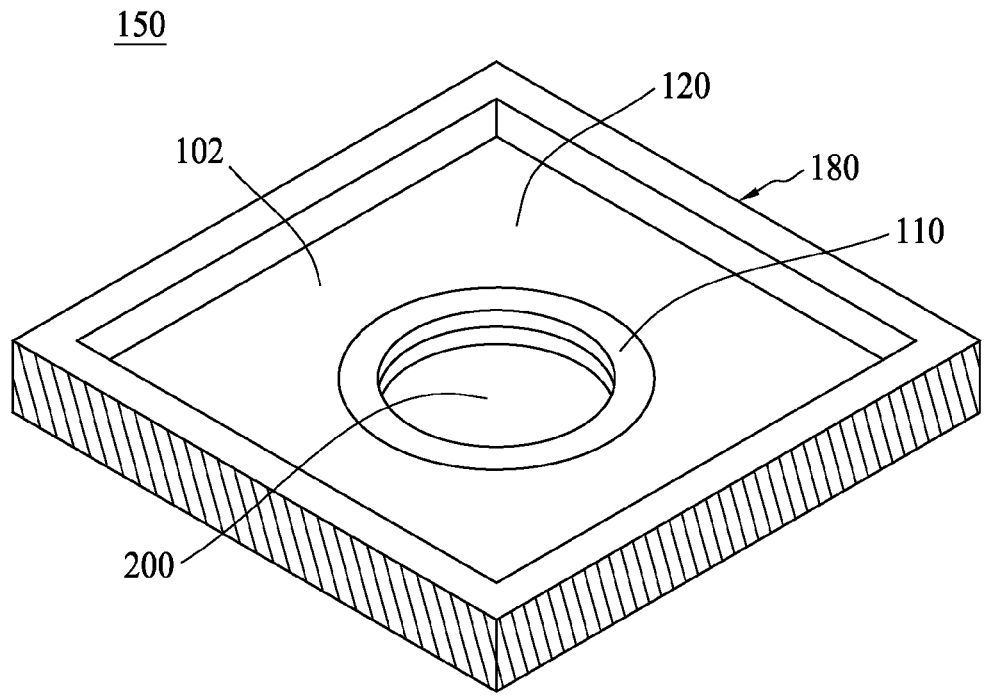
Figure 9B:
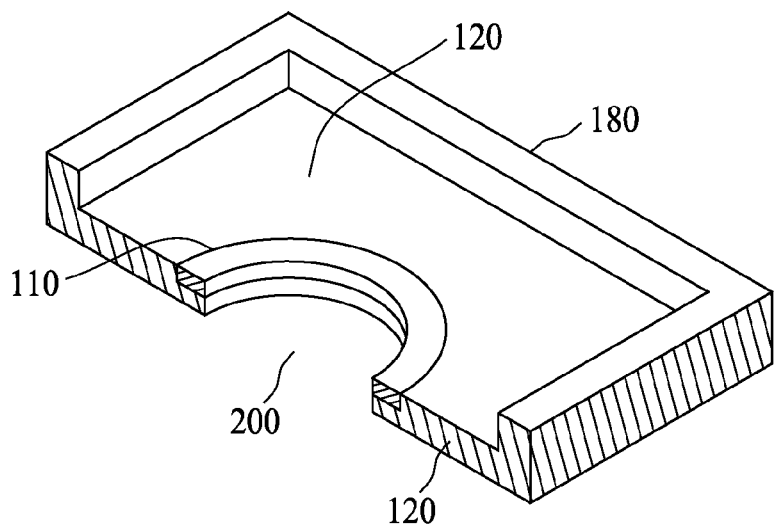
Figure 12A:
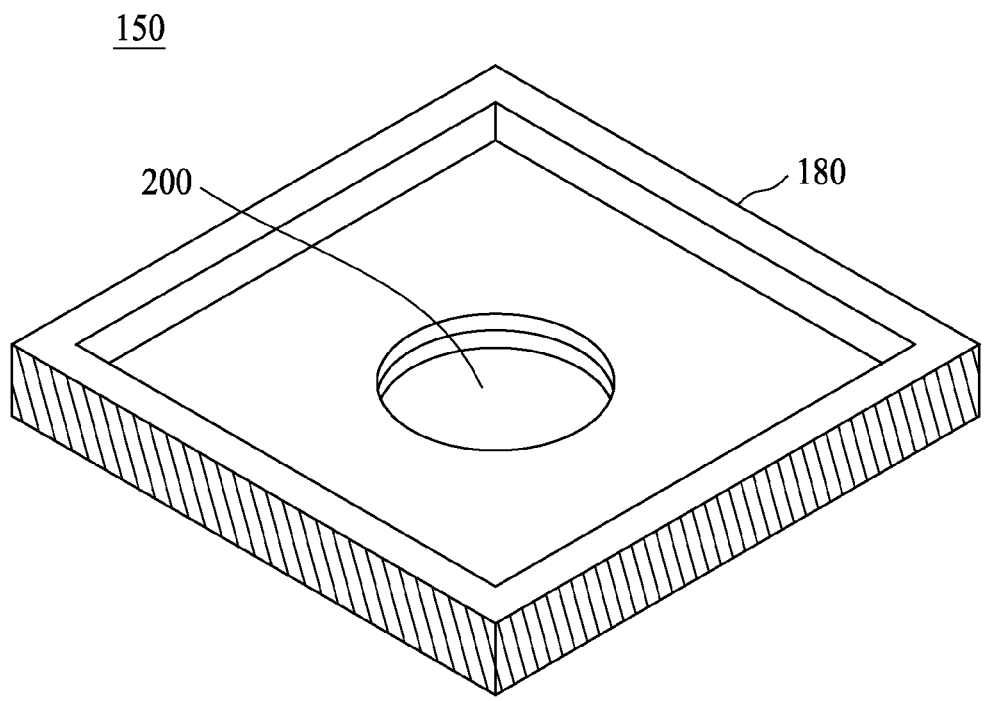

The design of each singulation site 150 with a rim varies as shown in the following embodiments of FIGS. 9A/9B to FIGS. 12A/12B. FIG. 9A and FIG. 9B include a unit singulation site 150 having a deformable portion 110 in cylindrical shape and surrounding the perimeter of the vacuum hole top opening. The singulation site 150 further has a peripheral portion 120. As discussed, shapes other than cylindrical may be used.

Figure 10A:
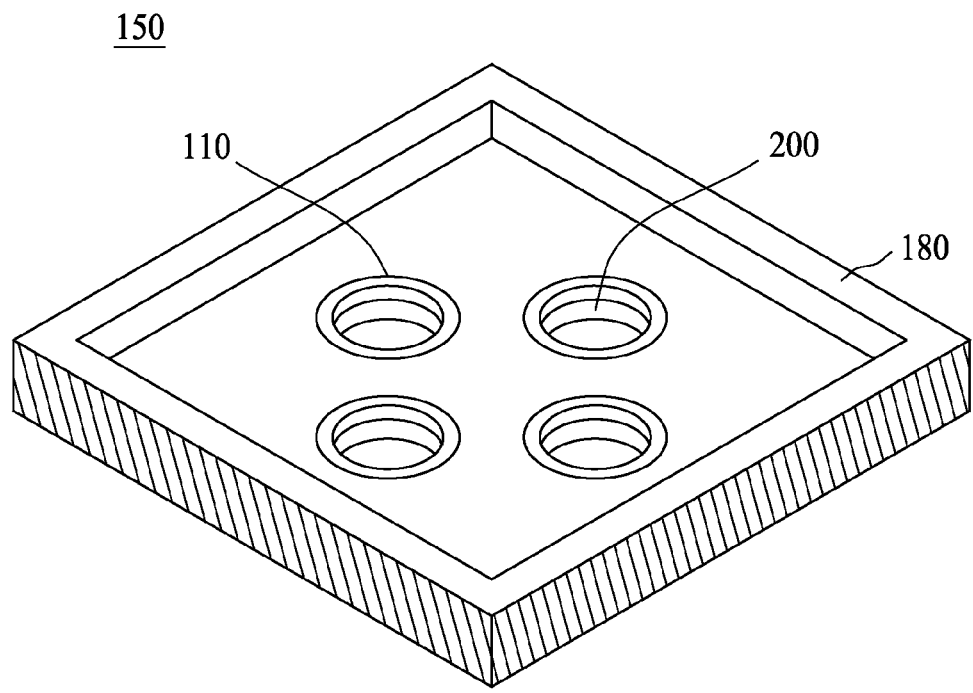
Figure 10B:
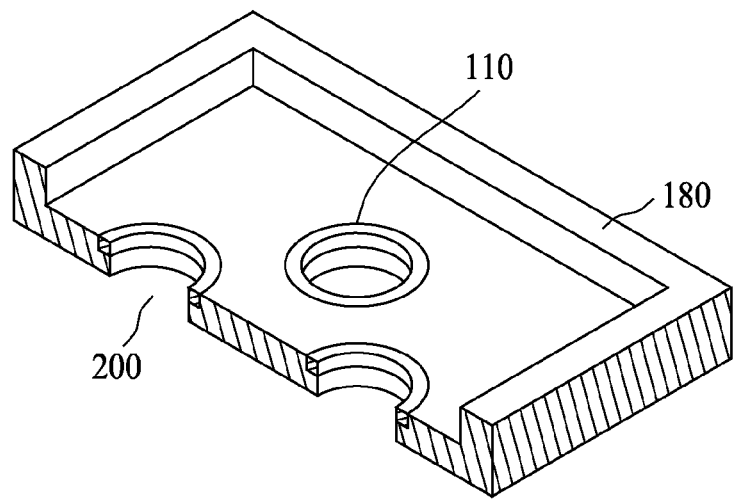

In some embodiments, the more than one vacuum hole is used per singulation site. FIG. 10A and FIG. 10B include a unit singulation site 150 having four vacuum holes 200 and each vacuum hole has a corresponding deformable portion 110 in cylindrical shape and surrounding the perimeter of each vacuum hole. According to various embodiments, two or more vacuum holes 200 may be used. According to various embodiments, the vacuum holes are placed symmetrically about a center of the to-be singulated semiconductor device.

Figure 11A:
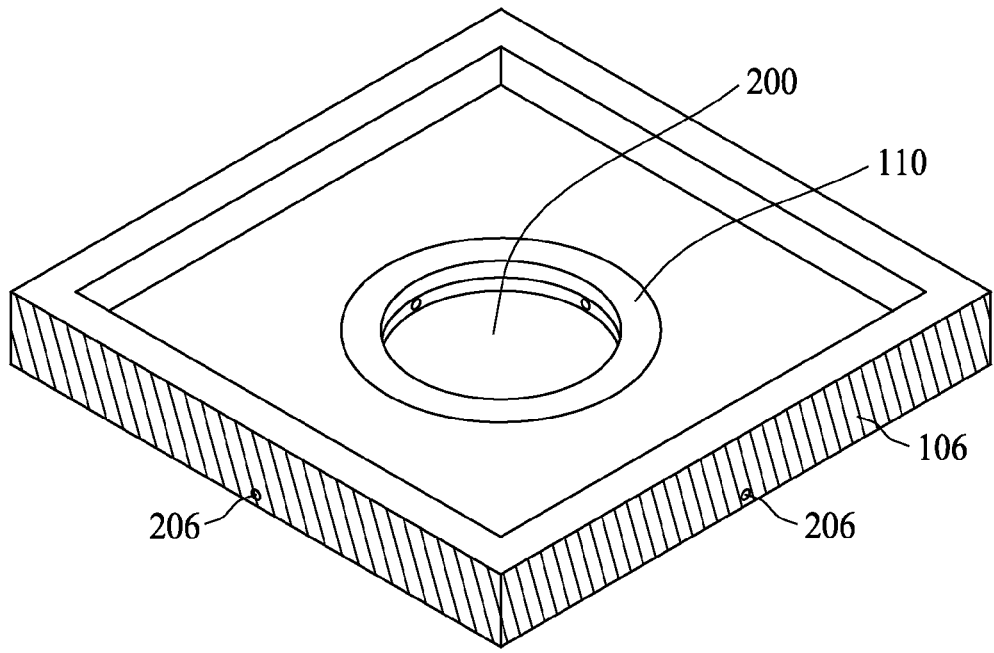
Figure 11B:
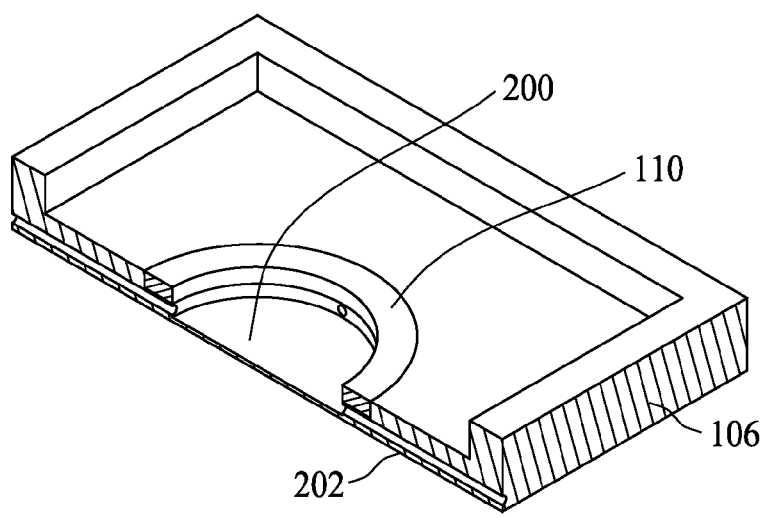

In some embodiments, the source end of the vacuum hole is located at a sidewall. In these embodiments, a bottom surface of the carrier does not have vacuum holes. Referring to FIG. 11A and FIG. 11B, at least two channels 202 are associated with the vacuum hole 200. Each channel 202 has a source end 206 at a corresponding sidewall 106. The channels 202 of singulation sites in a row or column of the carrier are connected. The carrier may be one single piece with channels 202 connecting the vacuum holes in different singulation sites. The source ends of singulation sites located at the edge of the carrier provide the inlets for introducing vacuum. Vacuum pressure is designed to be high enough to apply enough force on each singulation site to immobilize the semiconductor substrate during operation.

Figure 12B:
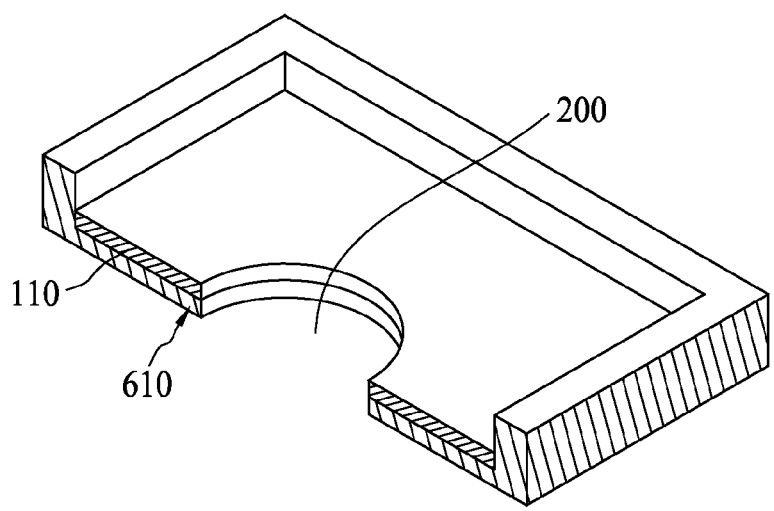

In some embodiments, the deformable portion covers the surface of the singulation site. FIG. 12A and FIG. 12B include a singulation site 150 which is a composite plate structure. The composite plate structure has a deformable plate 110 disposed on another plate 610. The plate 610 is more rigid than the deformable plate 110.

Figure 13A:
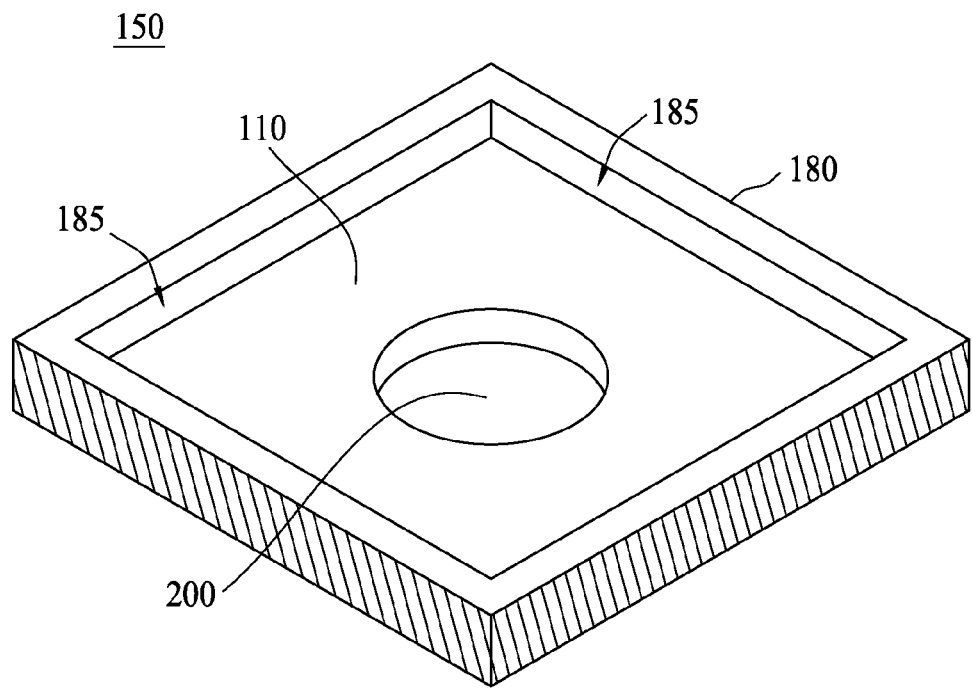
Figure 13B:
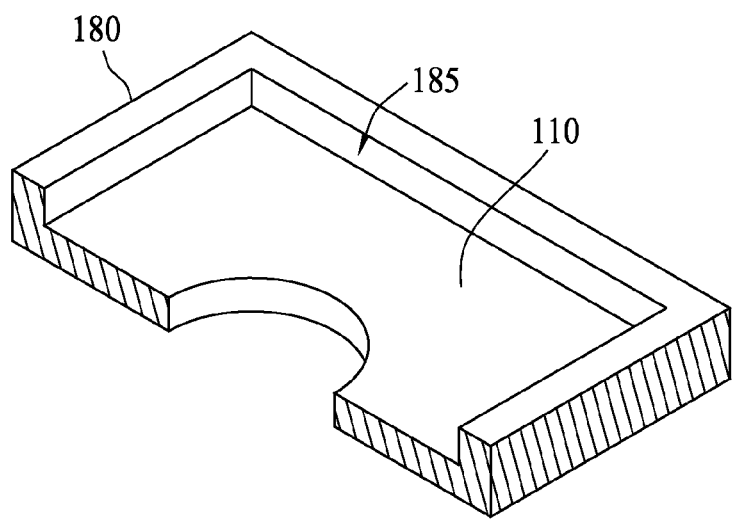

In some embodiments, the rim is deformable. Referring to FIG. 13A and FIG. 13B, the deformable portion 110 is a plate with a through vacuum hole 200. The singulation site 150 is molded to have the deformable portion 110 and an integrated rim 180. The inner walls 185 of the rim 180 are designed to be proximately located to the side wall of each to-be singulated semiconductor device 20. Therefore, in additional to the seal formed between the deformable portion 110 and the semiconductor substrate 50, a second seal is formed between the rim 180 and areas between the to-be singulated semiconductor device when vacuum is introduced into the vacuum hole. In some embodiments, the deformable portion 110 and the rim 180 are different materials having different rigidity.

Figure 14:
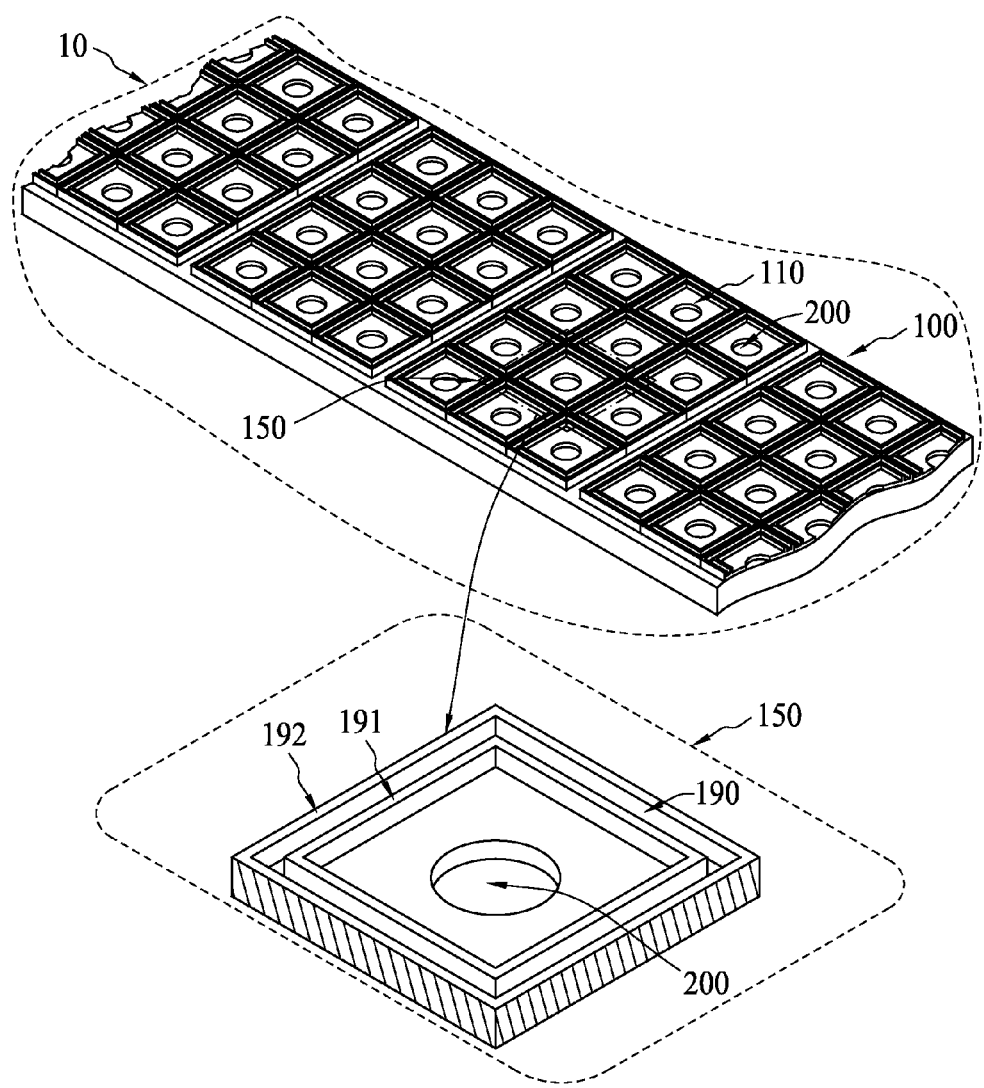
FIG. 14 is an exploded schematic a singulation apparatus having a plurality of singulation sites on a carrier in accordance with various embodiments of the present disclosure.

In some embodiments, each singulation site further has a groove between the vacuum hole and the scribe line. Referring to FIG. 14, a singulation apparatus 10 has a plurality of singulation sites 150. Each singulation site 150 has a groove 190 located between a vacuum hole 200 and a scribe line 105. The groove 190 has an inner wall 191 proximate to the vacuum hole 200. The groove 190 further has an outer wall 192 proximate to the scribe line 105. The inner wall 191 separate the vacuum hole 200 from the groove 190. The inner wall 191 keeps the vacuum retained in the space enclosed by the inner wall 191. In some embodiments, the inner wall 191 is deformable. The groove 190 is configured to accommodate a portion of a to-be singulated semiconductor device.

In some embodiments as shown in FIG. 15, a singulation site 150 has a groove 190 and a warped semiconductor device 20 having a plurality of bumps 25. The semiconductor device also has a die 22 mounted on a substrate and surrounded by the bumps 25. The bumps 25 may cause an uneven contact between the singulation site 150 and the semiconductor device 20. The groove 190 is configured to accommodate the bumps 25 while disposing the semiconductor device 20 on the singulation site 150. The inner wall 191 isolates the bumps 25 from the vacuum hole 200. The vacuum force introduced into the vacuum hole applies on the die 22 to secure the semiconductor device 20 on the singulation site 150 during cutting or other operations. Therefore, the bumps 25 do not interfere with the vacuum on the die 22 during cutting or other operations.

Figure 16A:
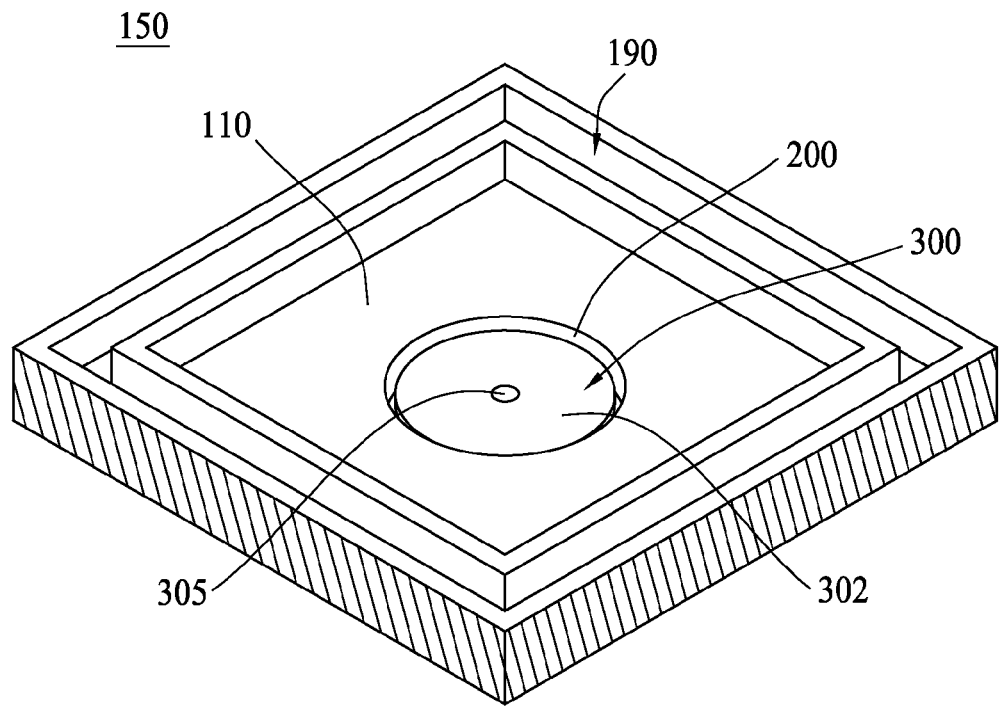
FIGS. 16A and 16B are perspective view and a section view of a design of a singulation site including a chuck in a vacuum hole in accordance with various embodiments of the present disclosure.
Figure 16B:
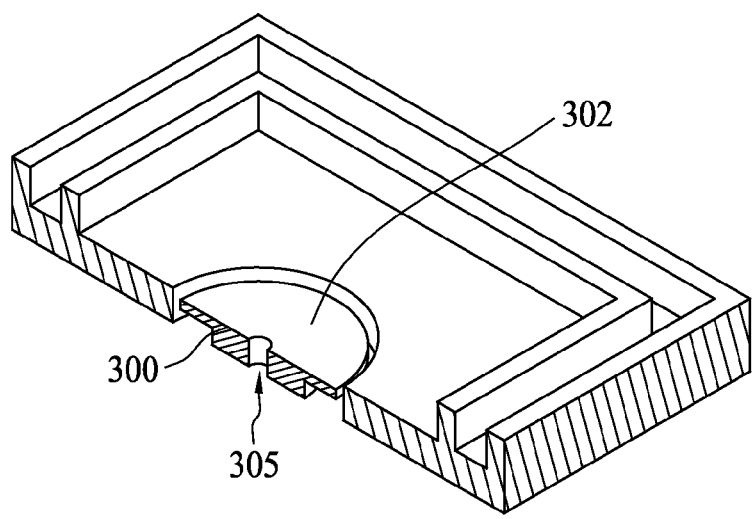

In some embodiments, a chuck is used in the vacuum hole. Referring to FIG. 16A and FIG. 16B, a singulation site 150 has a vacuum hole 200 and a chuck 300 in the vacuum hole 200. The singulation site 150 has a deformable portion 110. The chuck 300 has a first surface 302 and a vacuum hole 305. In some embodiments, the vacuum hole 305 is not used. The first surface 302 is configured to support the semiconductor substrate while a vacuum force is applied on a to-be singulated semiconductor substrate. The level of the first surface 302 is adjustable according to the requirement of an operation. In some embodiments, the first surface 302 is lower than the top surface of the deformable portion 110. In some embodiments, the first surface 302 is coplanar with the top surface of the deformable portion 110. The size of the vacuum hole is larger than the chuck therein. In some embodiments, the size of the chuck is designed to be between about 30% and 50% of the semiconductor device. In other embodiments, the size of the chuck is designed to be between about 50% and 70% of the semiconductor device. In still other embodiments, the size of the chuck is designed to be between about 70% and 80% of the semiconductor device.

One of the factors to select the material for the chuck is to ensure that the chuck deforms less than the deformable portion when both parts are applied by a force of a same magnitude. One of the characteristic properties used to measure the difference is the stiffness. The stiffness of the chuck is higher than the deformable portion. In some embodiments, there are various measurements used to compare the stiffness between the chuck and the deformable portion. For example, the elasticity is an index to compare the stiffness. In some embodiments, the deformable portion is HDPE (High Density Polyethylene) and its Young's Modulus (Modulus of Elasticity) is $0.8 \times 10^9$ GPa, the chuck is silicon carbide and its Young's Modulus is $450 \times 10^9$ GPa. Another measurement of the stiffness can be adopted is the Shore A or Shore D hardness. In some embodiments, the Shore A hardness of the deformable portion is between Shore A=55 and Shore A=90. A wide variety of materials can be selected for the chuck such as metal, ceramic, graphite etc., as long as the chuck can deform less than the deformable portion.

Figure 17:
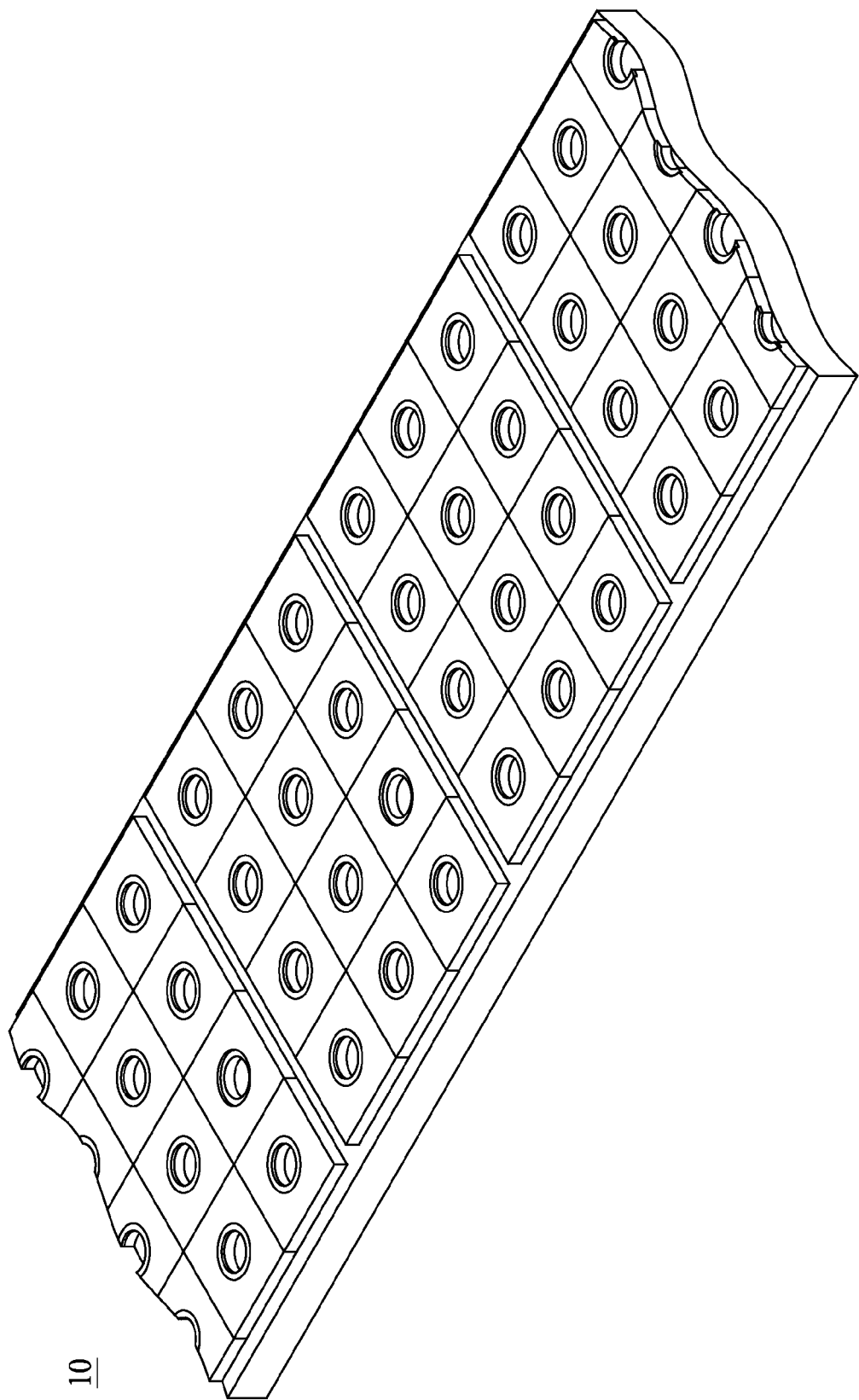
FIG. 17 is a schematic of a singulation apparatus configured to heat up a semiconductor device in accordance with various embodiments of the present disclosure.

Referring to FIG. 17 for some embodiments according to the present disclosure, a singulation apparatus 10 is configured to be a heat table to dry blocks. The arrangement of the singulation sites is similar to the apparatus configured for a sawing operation. Each singulation site 150 in the apparatus can accommodate a unit semiconductor device.

Figure 18:
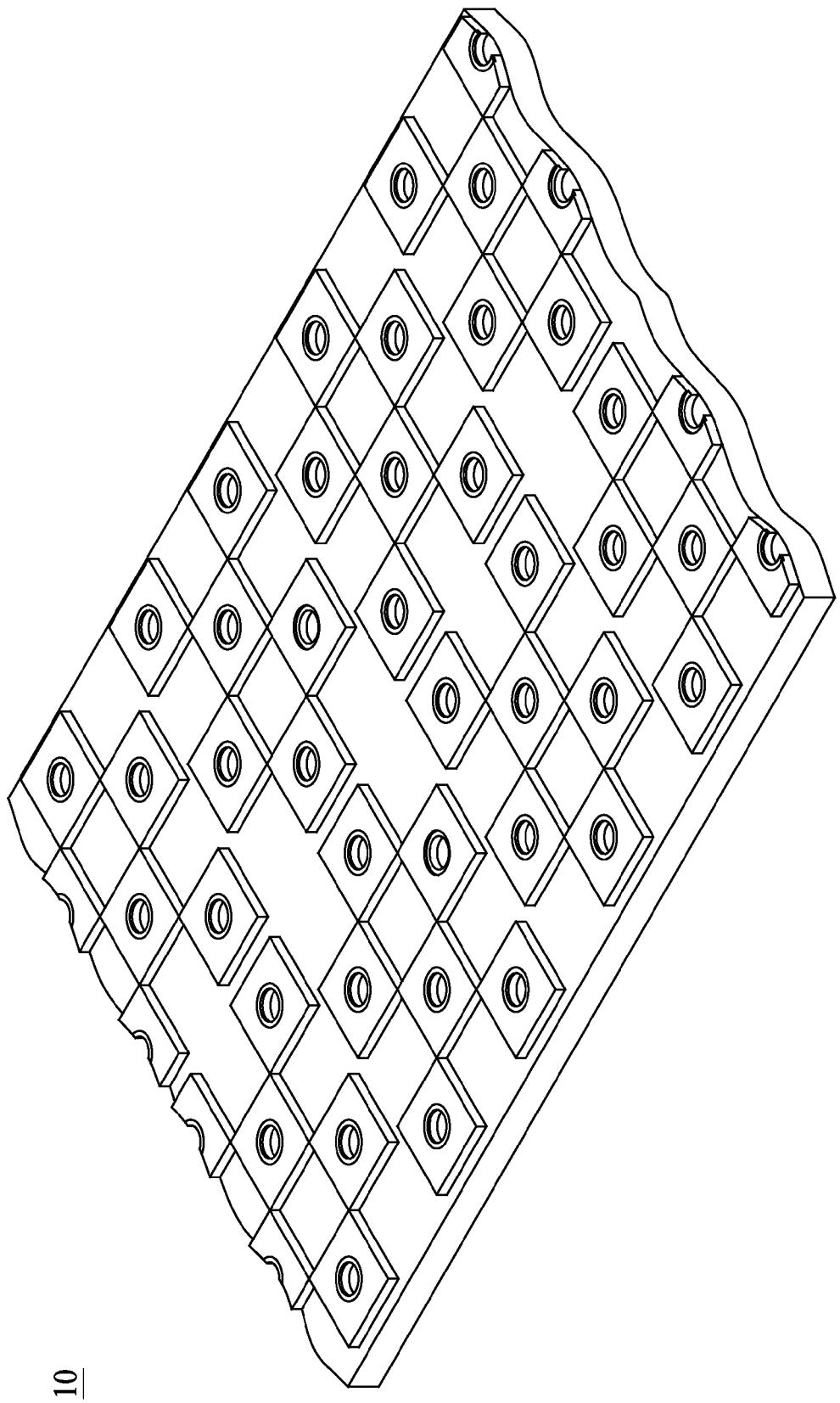
FIG. 18 is a schematic of a singulation apparatus configured to pick and place a semiconductor device in accordance with various embodiments of the present disclosure.

Referring to FIG. 18 for some embodiments according to the present disclosure, a singulation apparatus 10 is configured to be a turn table used to pick and place singulated semiconductor devices. The arrangement of the singulation sites 150 is different from the heat table. The purpose of a different arrangement is to facilitate transferring a unit semiconductor device during pick-and-place operation. Each singulation site in FIG. 19 and FIG. 20 adopts the same design as described in the abovementioned various embodiments.

Figure 19:
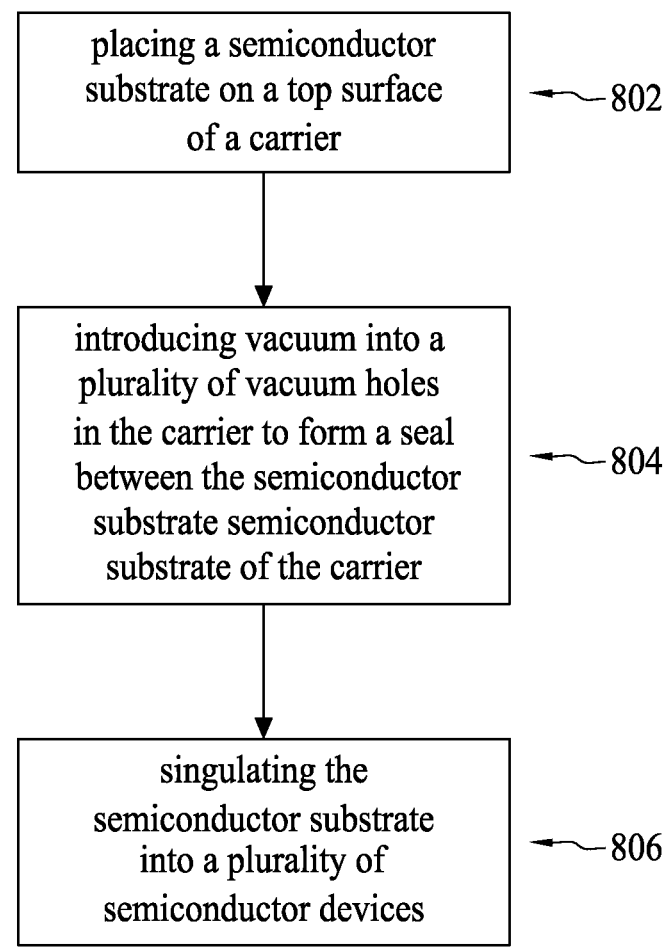
FIG. 19 is a method of manufacturing semiconductor devices in accordance with various embodiments of the present disclosure.

FIG. 19 is a method 800 of manufacturing semiconductor devices according to some embodiments according to the present disclosure. In operation 802, a semiconductor substrate is placed on a top surface of a carrier. The carrier has a number of vacuum holes and a deformable portion. In operation 804, vacuum is introduced into the vacuum holes to form a seal between the semiconductor substrate and the deformable portion. In operation 806 the semiconductor substrate is singulated into a number of individual semiconductor devices. In some embodiments according to the present disclosure, there is another operation of inserting a detachable deformation portion into the carrier before placing a semiconductor substrate on a top surface of a carrier. In some embodiments according to the present disclosure, there is another operation of removing a detachable deformation portion from the carrier after singulating a semiconductor substrate into a number of individual semiconductor devices.

Figure 20A:
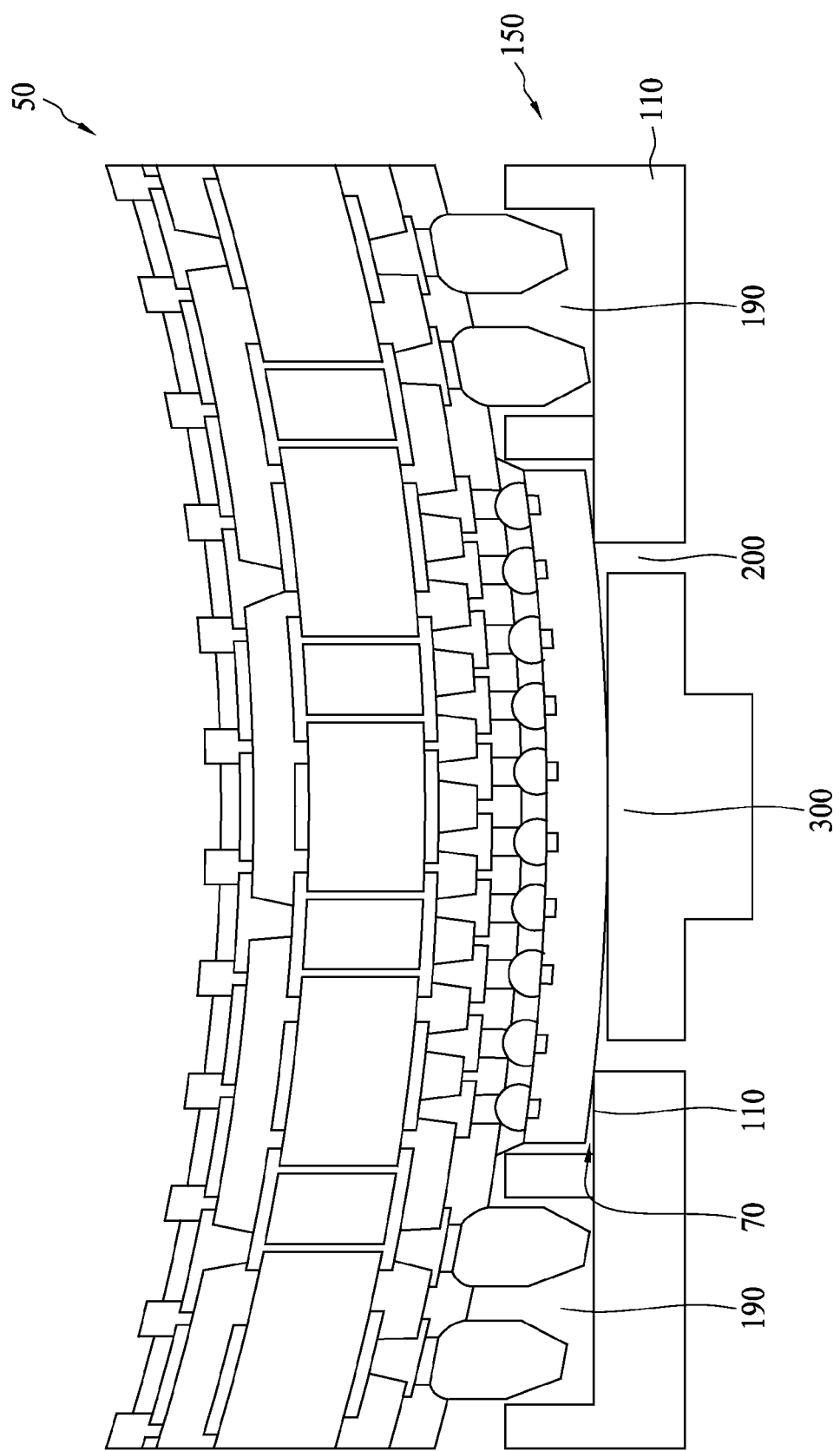
FIG. 20A and FIG. 20B are operations of a process of disposing a semiconductor substrate on a singulation site in accordance with various embodiments of the present disclosure.
Figure 20B:
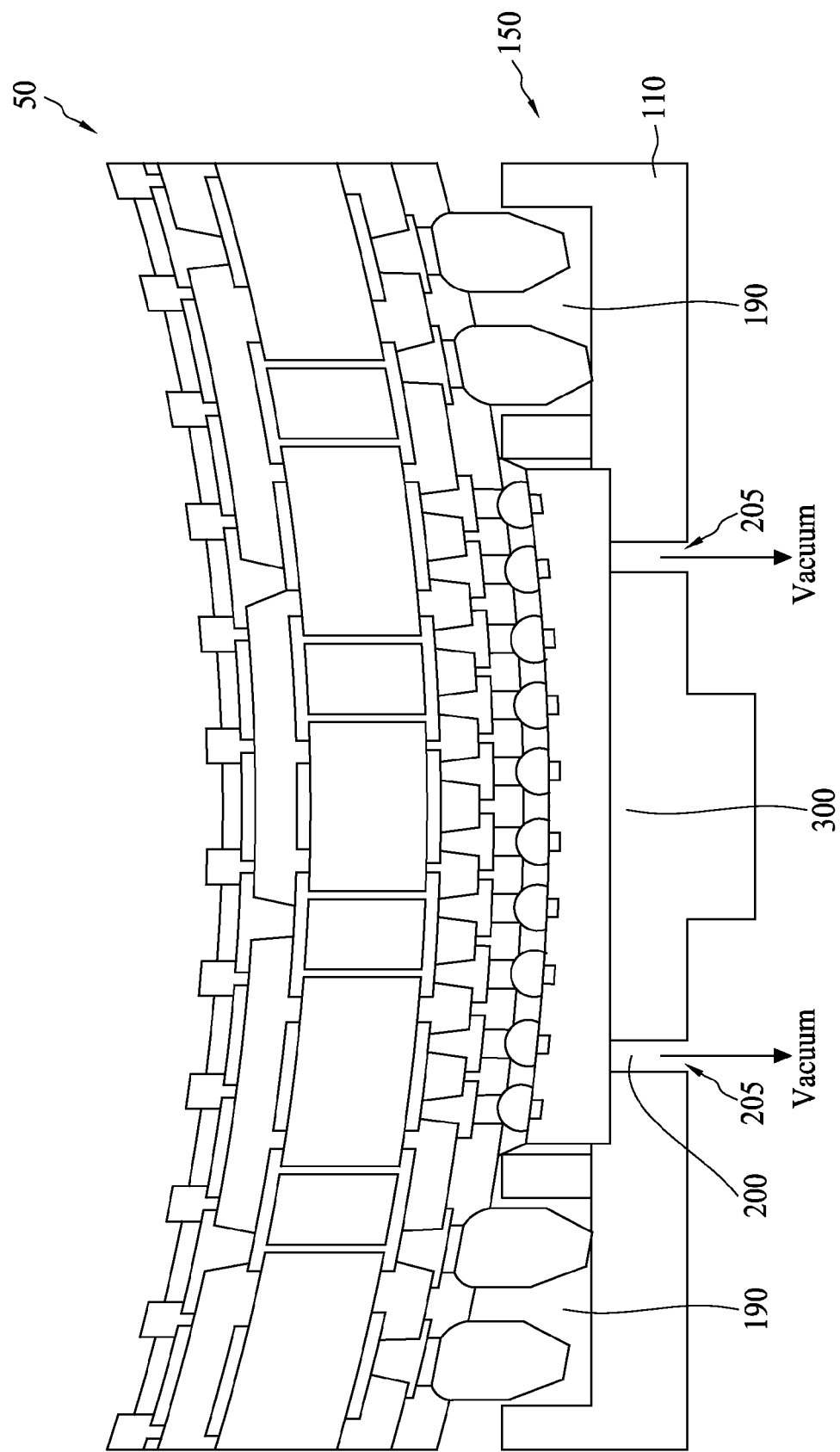
Figure 21:
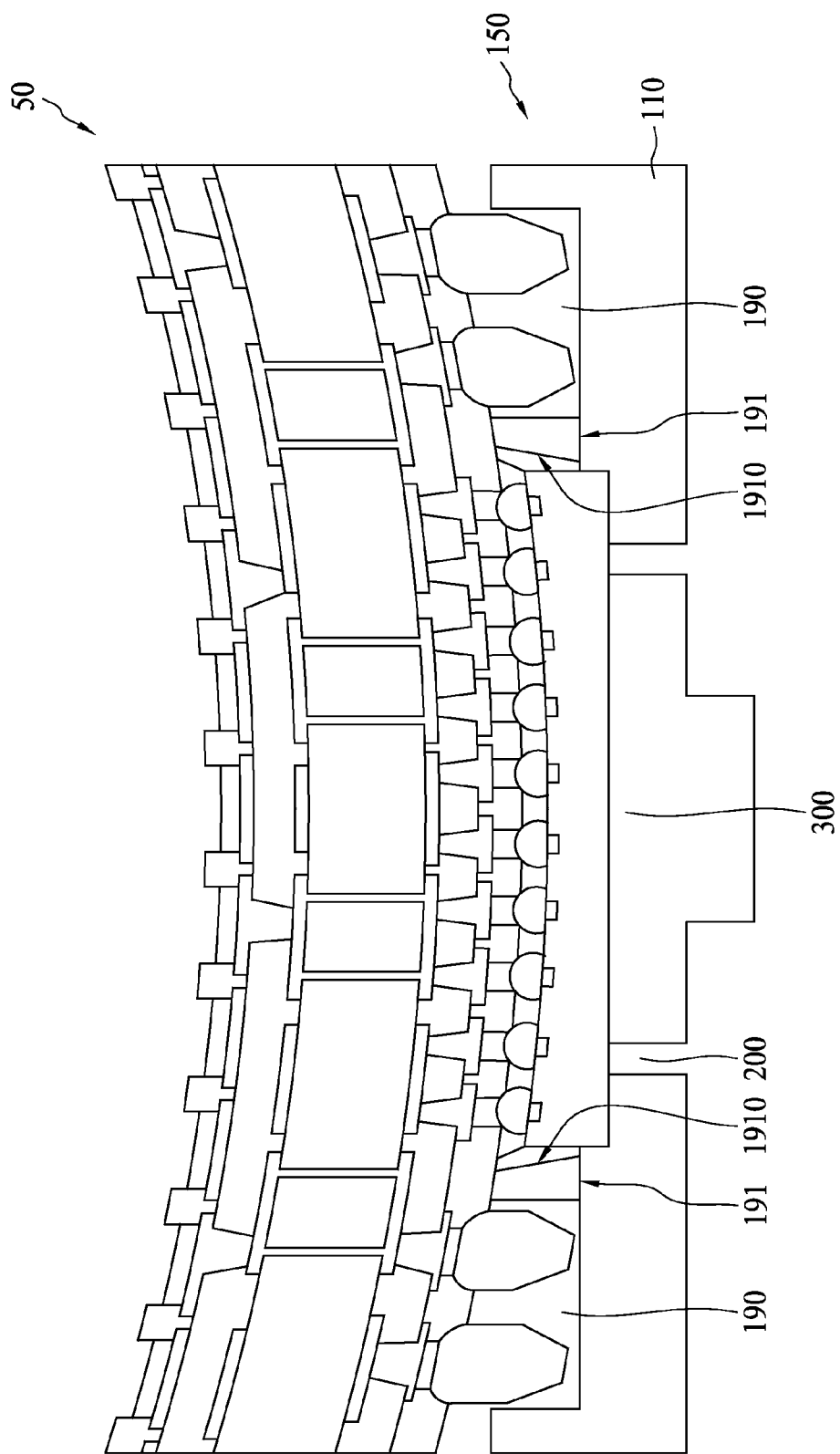
FIG. 21 is a schematic of an operation of a process of disposing a semiconductor substrate on a singulation site in accordance with various embodiments of the present disclosure

A method of singulating a semiconductor substrate of some embodiments according to the present disclosure is referred in FIG. 20A to FIG. 20B. In FIG. 20A, a warped semiconductor substrate 50 is placed on a singulation site 150. A gap 70 may exist between the semiconductor substrate 50 and the top surface of the deformable portion 110. In FIG. 20B, vacuum is introduced into the back end 205 of the vacuum hole 200. The vacuum forced the warped semiconductor substrate 50 against the deformation potion 110; thus, the deformation potion 110 deforms and contacts with the semiconductor substrate 50 without the gap. Therefore, the deformation potion 110 and the substrate 50 form a seal to avoid vacuum leakage. The chuck 300 in the vacuum hole 200 supports a portion of the substrate 50. In FIG. 21, during an operation of introducing a vacuum force on the semiconductor substrate according to the present disclosure, the inner wall 191 is also deformed. The inner wall 191 of the groove 190 may lean when it contacts with the semiconductor substrate 50. A seal is formed between the inner wall 191 and the semiconductor substrate.

According to some embodiments of the present disclosure, a singulation apparatus includes a carrier having a number of singulation sites and a scribe line between each of the singulation sites and an adjacent singulation site. The carrier has a top surface and the top surface is configured to receive a semiconductor substrate thereon. Each of the singulation sites includes a deformable portion and at least one vacuum hole. The at least one vacuum hole and the deformable portion is configured to form a seal around the at least one vacuum holes when a force is applied.

According to some embodiments of the present disclosure, a singulation apparatus includes a carrier having a deformable portion proximate to a top surface of the carrier. The top surface is configured to receive a semiconductor substrate. The singulation apparatus also has a number of vacuum holes in the carrier with one end from the top surface. The singulation apparatus further has a number of chucks in the vacuum holes. Each chuck has a first surface configured to support the semiconductor substrate when the deformable portion is deformed.

According to some embodiments of the present disclosure, a method of manufacturing semiconductor devices includes an operation of placing a semiconductor substrate on a top surface of a carrier. The method also has an operation of introducing vacuum into the vacuum holes in the carrier to form a seal between the semiconductor substrate and a deformable portion of the carrier. The method further has an operation of singulating the semiconductor substrate into a plurality of semiconductor devices.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A singulation apparatus comprising:
   a carrier including a plurality of singulation sites and a scribe line between each of the plurality of singulation sites and an adjacent singulation site, wherein a top surface of the carrier is configured to receive a semiconductor substrate thereon;
   and wherein each of the plurality of singulation sites includes a deformable portion, a peripheral portion surrounding the deformable portion, and at least one vacuum hole,
   wherein the deformable portion circumscribes the at least one vacuum holes, and wherein the scribe line circumscribes the peripheral portion.

2. The apparatus of claim 1, wherein the deformable portion is a polymer.

3. The apparatus of claim 1, wherein the deformable portion is a cylinder.

4. The apparatus of claim 1 wherein each of the plurality of singulation sites has a rim between at least one vacuum hole and the scribe line.

5. The apparatus of claim 1, wherein one end of the at least one vacuum hole is on a bottom surface of the carrier, wherein the bottom surface is opposite to the top surface.

6. The apparatus of claim 1, wherein the semiconductor substrate is a packaged substrate.

7. The apparatus of claim 1, wherein the deformable portion is detachable.

8. The apparatus of claim 1, further comprising a peripheral portion, the peripheral portion being more rigid than the deformation portion.

9. The apparatus of claim 8, wherein a top of the deformation portion is coplanar with a top of the peripheral portion.

10. The apparatus of claim 8, wherein a top of the deformation portion is extruding from a top of the peripheral portion.

11. The apparatus of claim 8, a plurality of vacuum holes being positioned symmetrically about a center of a singulation site.

12. The apparatus of claim 1, an overall size of the vacuum hole being from about 40% to about 90% of an area of the singulation site.

13. The apparatus of claim 1, a shape of the deformation portion is different from a shape of the at least one vacuum hole.

14. The apparatus of claim 1, wherein a hardness of the deformation portion is between about Shore D of 10 and about Shore D of 100.

15. The apparatus of claim 1, wherein a hardness of the deformation portion is between about Asker C of 20 and about Asker C of 100.

16. A method of manufacturing semiconductor devices, the method comprising:
    placing a semiconductor substrate on a top surface of a carrier;
    introducing vacuum into a plurality of vacuum holes in the carrier to form a seal between the semiconductor substrate and a deformable portion of the carrier; and
    singulating the semiconductor substrate into a plurality of semiconductor devices along a scribe line between each of a plurality of singulation sites on the top surface of the carrier; and
    wherein each of the plurality of singulation sites comprises a peripheral portion surrounding the deformable portion, the deformable portion circumscribing the vacuum hole, and the scribe line circumscribing the peripheral portion of each of the plurality of singulation sites.

17. The method of claim 16 further comprising inserting a detachable deformable portion in the carrier.

18. The method of claim 17, wherein the deformation portion is inserted around a perimeter of the vacuum hole.

19. The method of claim 17, wherein the inserting the deformation portion comprises inserting a polymer in the carrier.

20. A singulation apparatus comprising:
    a carrier including a plurality of singulation sites and a scribe line between each of the plurality of singulation sites and an adjacent singulation site, wherein a top surface of the carrier is configured to receive a semiconductor substrate thereon; and
    a peripheral portion, the peripheral portion being more rigid than the deformation portion; and
    wherein each of the plurality of singulation sites includes a deformable portion and at least one vacuum hole, wherein the at least one vacuum hole and the deformable portion is configured to form a seal around the at least one vacuum holes when a force is applied, and
    wherein a plurality of vacuum holes being positioned symmetrically about a center of a singulation site; and
    each vacuum hole having a corresponding deformable portion surrounding a perimeter of each vacuum hole.

21. The singulation apparatus of claim 20, a shape of the deformation portion is different from a shape of the at least one vacuum hole.

22. The singulation apparatus of claim 20, wherein a top of the deformation portion is extruding from a top of the peripheral portion.

23. The singulation apparatus of claim 20, wherein a top of the deformation portion is coplanar with a top of the peripheral portion.

24. The singulation apparatus of claim 20, wherein the deformation portion is inserted around a perimeter of the vacuum hole.

25. The singulation apparatus of claim 20, wherein the deformation portion is detachable.

26. The singulation apparatus of claim 20, an overall size of the vacuum hole being from about 40% to about 90% of an area of the singulation site.

27. The singulation apparatus of claim 20, wherein each of the plurality of singulation sites has a rim between at least one vacuum hole and the scribe line.

* * * * *